US011302867B2

(12) United States Patent
Tang et al.

(10) Patent No.: US 11,302,867 B2
(45) Date of Patent: Apr. 12, 2022

(54) METHOD OF MAKING RESISTIVE STRUCTURE OF RRAM

(71) Applicant: SHANGHAI HUALI MICROELECTRONICS CORPORATION, Shanghai (CN)

(72) Inventors: Youqing Tang, Shanghai (CN); Zhigang Zhang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 16/850,993

(22) Filed: Apr. 16, 2020

(65) Prior Publication Data

US 2021/0098699 A1 Apr. 1, 2021

(30) Foreign Application Priority Data

Sep. 26, 2019 (CN) .......................... 201910914900.X

(51) Int. Cl.
*H01L 45/00* (2006.01)

(52) U.S. Cl.
CPC ...... *H01L 45/1683* (2013.01); *H01L 45/1233* (2013.01); *H01L 45/1253* (2013.01); *H01L 45/146* (2013.01)

(58) Field of Classification Search
CPC ............ H01L 45/1683; H01L 45/1233; H01L 45/1253; H01L 45/146; H01L 45/1675
See application file for complete search history.

(56) References Cited

U.S. PATENT DOCUMENTS

| 2012/0083117 A1* | 4/2012 | Ahn ..................... H01L 21/7682 438/653 |
| 2014/0158966 A1* | 6/2014 | Kim ....................... H01L 45/16 257/4 |
| 2019/0044065 A1* | 2/2019 | Tseng .................... H01L 45/146 |
| 2020/0111958 A1* | 4/2020 | Ando ..................... H01L 45/04 |
| 2020/0203603 A1* | 6/2020 | Glassman ........... H01L 45/1253 |

OTHER PUBLICATIONS

Wen-Horng Lee et al., Characterization of tantalum nitride films deposited by reactive sputtering of Ta in N2/Ar gas mixtures, Materials Chemistry and Physics 68 (2001) 266-271 (Year: 2001).*
H. K. Yoo et al., Conversion from unipolar to bipolar resistance switching by inserting layer Ta2O5 layer in Pt/TaOx/Pt cells, Appl. Phys. Lett. 98, 183507 (2011) (Year: 2011).*

* cited by examiner

Primary Examiner — Shih Tsun A Chou
(74) Attorney, Agent, or Firm — Alston & Bird LLP

(57) ABSTRACT

A method for making an RRAM resistive structure includes, step 1, forming a via structure, which includes depositing an ultra-low dielectric constant material layer on a substrate, depositing a copper layer on the ultra-low dielectric constant material layer, depositing a carbon-containing silicon nitride layer, and patterning a via in the carbon-containing silicon nitride layer. step 2, filling the via structure with a TaN layer, followed by planarizing a surface of the via structure without dishing; step 3, forming a first TiN layer on the TaN-filled via structure; and step 4, forming an RRAM resistive structure stack having layers of TaOx, Ta$_2$O$_5$, Ta, and a second TiN from bottom to top on the first TiN layer, and step 5, patterning the RRAM resistive structure stack the first TiN layer over the TaN-filled via structure to form the RRAM resistive structure.

11 Claims, 6 Drawing Sheets

METHOD OF MAKING RESISTIVE STRUCTURE OF RRAM

CROSS-REFERENCES TO RELATED APPLICATIONS

This application claims priority to Chinese patent application No. CN201910914900 filed at the CNIPA on Sep. 26, 2019, and entitled "METHOD OF MAKING RESISTIVE STRUCTURE OF RRAM", the disclosure of which is incorporated herein by reference in entirety.

TECHNICAL FIELD

The present application relates to the field of semiconductor manufacturing, and in particular, to a method for fabricating an Resistive Random-Access Memory (RRAM).

BACKGROUND

Resistive Random-Access Memories (RRAMs) change the resistance of a material, such as a metel oxide, between a high-resistance state and a low-resistance state corresponding to voltage changes applied to the material, thereby opening or blocking the passages of electric currents through the RRAM electrodes. This characteristic of RRAMs is used for data storage. RRAMs are a type of resistive memory, which still stores charge after power off, so this character enables fast data transmission. RRAMs are thus considered as a fourth type of memory elements for IC circuits.

The key structure of a RRAM is the resistive material structure, typically a TiN/TaO/Ta/TiN structure. This structure allows a reversible conversion of a memory element between a high-resistance state and a low-resistance state by changing a conductive channel when a positive voltage or a negative voltage is applied to store data. In this way, a bottom electrode can be formed by filling a via with TiN followed by performing chemical mechanical polishing (CMP) in the key structure for the previous process. However, since the stress on the TiN film on the sidewall of the chamber will be very high from the electromagnetic field acted by a bias voltage, cracks may occur to the via at the bottom, so that the TiN filling capacity by the standard physical vapor deposition (PVD) process is insufficient.

FIG. 1 shows a transmission scanning electron microscope (TEM) image of the bottom electrode of a current RRAM resistive structure. In FIG. 1, the via is not completely filled to the bottom with TiN and cavities are obvious. TiN has grown in the form of tufted lattice.

Referring to FIG. 2, another TEM view of a bottom electrode like in FIG. 1 shows a dishing in the bottom electrode post the planarization step.

Therefore, there is a need for a method for making a bottom electrode in RRAM resistive structure.

BRIEF SUMMARY OF THE DISCLOSURE

According to some embodiments in this application, a method for manufacturing an RRAM resistive structure is disclosed. Step 1, forming a via structure bottom electrode of the RRAM; Step 2, filling the via structure with a layer of tantalum nitride (TaN), performing planarization on the top surface of the via structure; Step 3, forming a titanium nitride TiN layer on the via structure; and Step 4, forming an RRAM resistive structure layer on the second TiN layer.

In some examples, forming the via structure in Step 1 comprises depositing an ultra-low dielectric constant material layer on a substrate, depositing a copper layer on the ultra-low dielectric constant material layer, depositing a carbon-containing silicon nitride layer, and patterning a via in the carbon-containing silicon nitride layer, wherein a bottom of the via exposes the copper layer.

In some examples, filling the via structure with the TaN layer in Step 2 applies a deposition method.

In some examples, In some examples, wherein the deposition method in Step 2 is a physical vapor deposition (PVD) process.

In some examples, the physical vapor deposition process in Step 2 is a PVD sputtering plate process.

In some examples, planarizing the surface of the via structure in Step 2 comprises terminating the planarization until an upper surface of the carbon-containing silicon nitride layer outside the via is exposed.

In some examples, forming the first TiN layer on the via structure in Step 3, comprise a deposition method.

In some examples, the deposition method for the first TiN layer is a physical vapor deposition method.

In some examples, the RRAM resistive structure stack formed on the first TiN layer in Step 4 comprises at least: a $TaO_x$ layer a $Ta_2O_5$ layer, a Ta layer, and a second TiN layer from bottom to top.

In some examples x in the TaOx is a fraction less than ⅖.

In some examples, the RRAM resistive structure stack further comprises one or more material layers between the TaOx layer and the Ta2O5 layer.

In some examples, the method further comprises Step 5, patterning the RRAM resistive structure stack the first TiN layer over the TaN-filled via structure to form the RRAM resistive structure.

Overall, the method for making an RRAM resistive structure bottom electrode of the present invention has the following beneficial effects: the present invention fills a via of an RRAM resistive structure bottom electrode with TaN, deposits TiN on a via structure, and combines TaN and TiN to obtain a fully and well filled via, avoiding the impact of directly using TaN as an electrode on the entire device while obtaining a bottom electrode with well filled TiN without causing a dishing occurrence after subjecting to CMP.

DETAILED DESCRIPTION OF THE INVENTION

Figure 1:
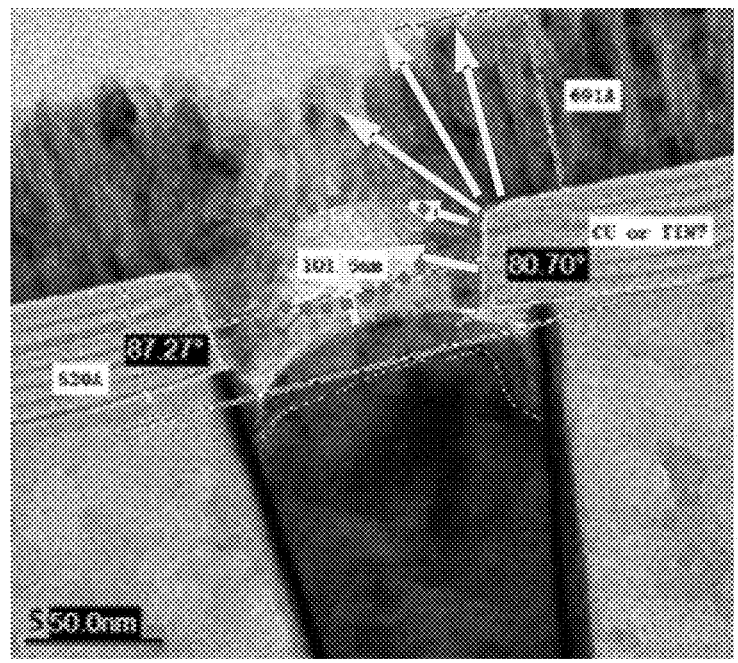
FIG. 1 shows a transmission electron microscope TEM view of a current RRAM having incompletely filled via.
Figure 2:
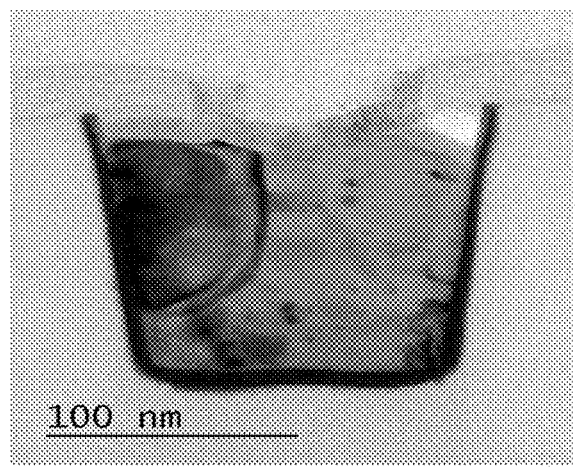
FIG. 2 illustrates a TEM view of the bottom electrode which shows a dishing occurrence after planarization.

The embodiments of the present invention are illustrated below by particular specific examples. Those skilled in the art can easily understand other advantages and effects of the present invention from the content disclosed in this specification. The present invention can also be implemented or applied through other different specific implementations. Various details in this specification can also be modified or changed based on different viewpoints and applications without departing from the spirit of the present invention.

It should be noted that the illustrations provided in this embodiment only illustrate the basic idea of the present invention in a schematic manner. Therefore, only the components related to the present invention are shown in the drawings, and the drawings are not drawn according to the number of components, shapes, and sizes in actual implementation. The shapes, number, and scales of the components can be changed arbitrarily in actual implementation, and the layout configuration of the components may be more complex.

Figure 3:
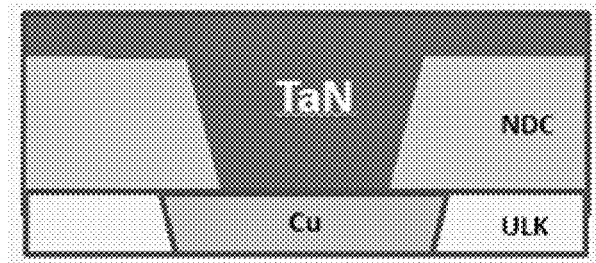
FIG. 3 shows a schematic view of a via structure of a RRAM bottom electrode filled with TaN. according to some embodiments of the present disclosure.
Figure 4:
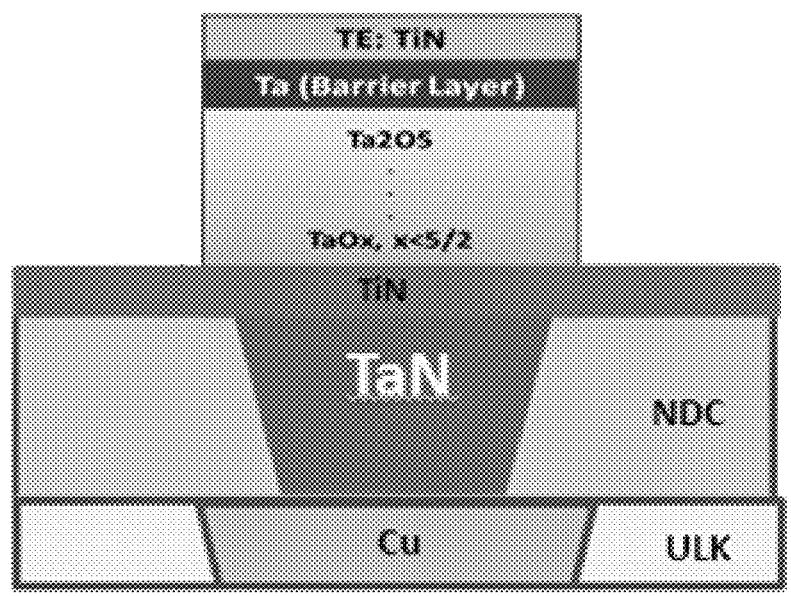
FIG. 4 shows a schematic cross sectional view of a resistive structure after TiN layer placed on the via structure, according to some embodiments of the present disclosure.
Figure 5:
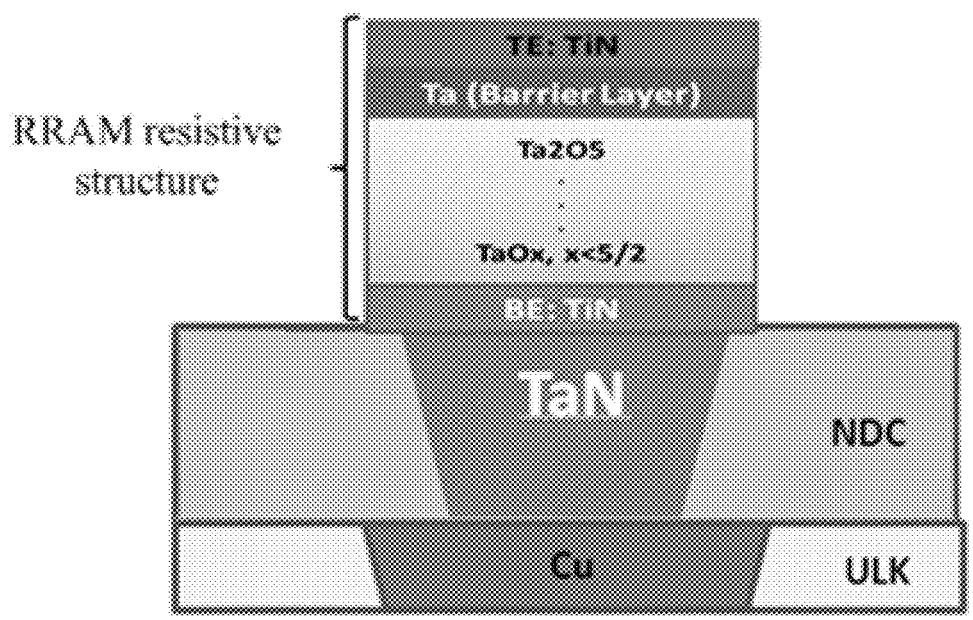
FIG. 5 shows a schematic cross sectional view of the resistive structure after the TiN layer is etched, according to some embodiments of the present disclosure.
Figure 6:
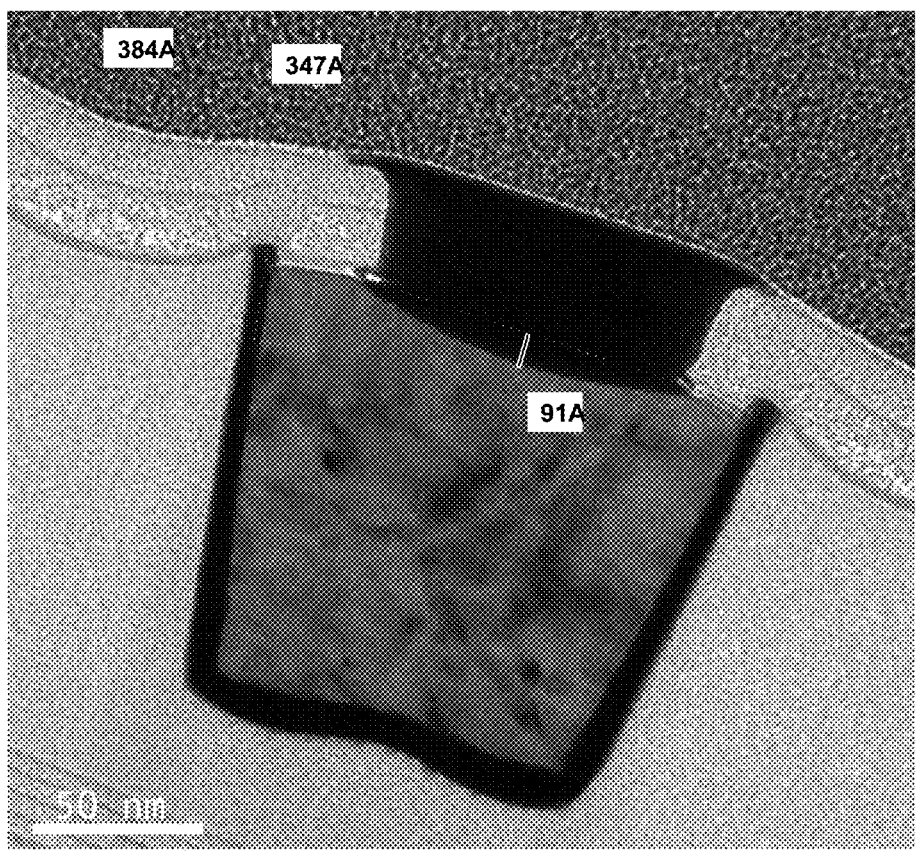
FIG. 6 is a TEM view of a TaN-filled via structure in the RRAM bottom electrode showing no cavities after planarization, fabricated according to some embodiments of the present disclosure.
Figure 7:
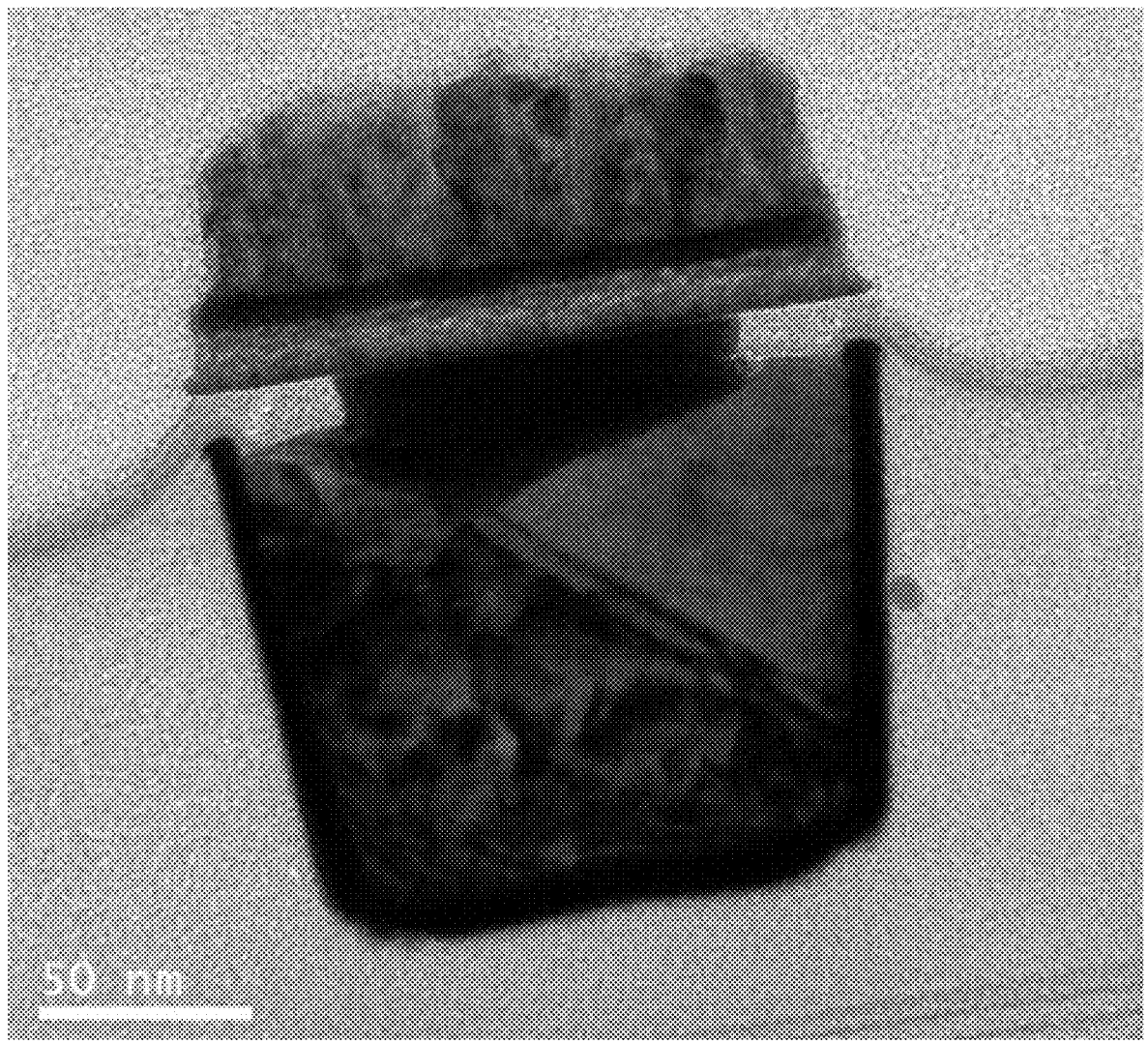
FIG. 7 is a TEM view of an RRAM resistive structure after etching showing a via structure below the RRAM resistive structure according to some embodiments of the present disclosure.
Figure 8:
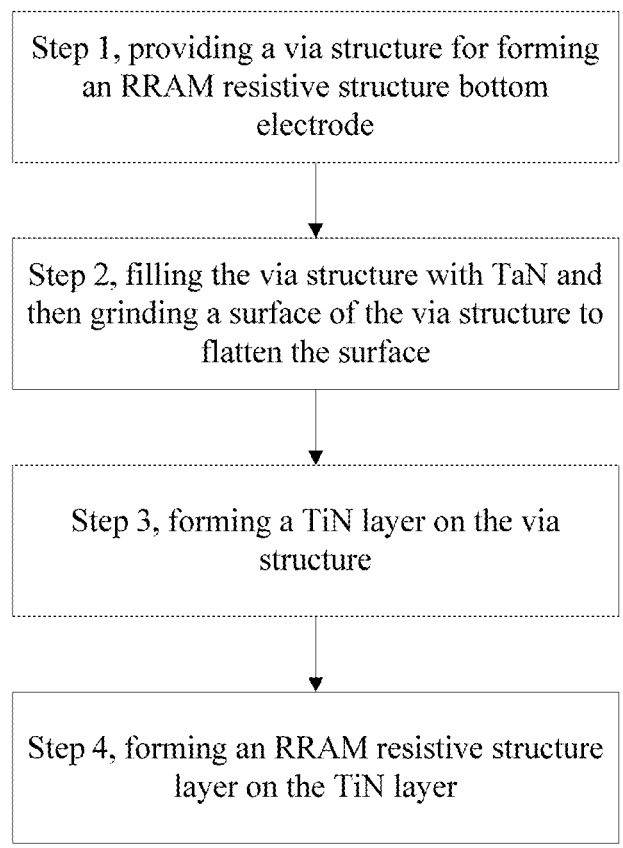
FIG. 8 shows a flow chart how to make the bottom electrode of the RRAM according to some embodiments of the present disclosure.

FIGS. 3-5 illustrate the step by step cross sectional views of the bottom electrode in an RRAM resistive structure. FIGS. 6-7 show TEM images of the bottom electrode of the RRAM resistive structure fabricated according to the disclosure. FIG. 8 summarizes the process flow diagram. The method making the bottom electrode of the RRAM resistive structure includes the following steps:

Step 1, making a via structure in process of forming the RRAM resistive structure bottom electrode. FIG. 3 shows a copper (Cu) layer is patterned in an ultra-low dielectric constant K material (ULK) on a substrate (not shown here) of the IC device. The Cu layer serves as the bottom electrode of the RRAM. A carbon-containing silicon nitride structure, also known as NDC, is deposited on the ULK layer. The via structure is patterned in the NDC layer, and the via is filled with a TaN layer. The Cu layer is made larger than the bottom of the TaN filled via, so the NDC layer is disposed partially on the Cu layer outside the via footing and partially on the ultra-low dielectric constant material (ULK).

As shown in FIG. 3, the copper layer and its surrounding ultra-low dielectric constant material (ULK) are located at the bottom of the RRAM structure.

In Step 2, a TaN layer is deposited to fill the via structure followed with performing a planarization process such as a chemical mechanical polishing (CMP) on the top TaN layer to expose the NDC layer outside the via as shown. In Step 2, a deposition method is applied to fill TaN in the via structure The deposition method may be a physical vapor deposition (PVD) method. The physical vapor deposition method may be a sputtering deposition process. As shown in FIG. 3, in Step 2 of the present invention, a surface of the via structure filled with TaN is planarized and the NDC surface outside the via is exposed. Preferably, in Step 2, the planarization completes when the upper surface of the carbon-containing silicon nitride structure outside the via is exposed. As a result, the upper surface of the TaN in the via is flush with the upper surface of the carbon-containing silicon nitride structure outside the via.

In Step 3, forming a TiN layer on the via structure. FIG. 4 illustrate that the TiN layer is disposed on the NDC layer including the via, and a resistive structure formed over the TiN layer on top of the TaN filled via structure. Because the upper surface of the TaN in the via is flush with the rest of the upper surface of the carbon-containing silicon nitride structure NDC, a TiN layer is deposited on the top surface of the via structure and the rest of the upper surface of the carbon-containing silicon nitride structure. In Step 3, depositing the TiN layer on the TaN and NDC includes is a physical vapor deposition, or a PVD process.

In Step 4, an RRAM resistive structure layer is formed on the TiN layer. A stack of layers including various materials are sequentially deposited on the TiN layer above the via structure. These stacked material layers constitute the RRAM resistive structure layer. According to one embodiment of the present disclosure, the stack of materials on the TiN layer includes at least: TaOx, $Ta_2O_5$, Ta, TiN in an order from bottom up. In addition to TaOx, $Ta_2O_5$, Ta, TiN, the RRAM resistive structure layer may further include other material layers in the stack, for example, some materials may be sandwiched between the TaOx and the $Ta_2O_5$ layers. Preferably, the material fraction x in the TaOx layer is less than $2/5$. Still further, according to the present invention, in the bottom-up RRAM resistive structure layer, some material layers are provided between the TaOx and the $Ta_2O_5$ so there is no direct contact between the TaOx and the $Ta_2O_5$ layers.

Further, according to embodiments of the present disclosure, making the bottom electrode for the RRAM resistive structure also comprises the step 5, patterning the full stack of the RRAM resistive structure including the TiN layers to form the RRAM. FIG. 4 shows forming and the stack of RRAM resistive structure by performing a patterning process. The etching is terminated at the bottom TiN layer.

FIG. 5 shows a schematic view of the RRAM resistive structure after the TiN layer is etched from FIG. 4. The patterned stack includes layers of, from top down, top TiN, Ta, $Ta_2O_5$ . . . TaOx, and the lowest layer TiN. Etching is terminated at the upper surface of the carbon-containing silicon nitride NDC structure outside the via. As a resultant RRAM resistive structure, it includes the stack of the TiN, Ta, $Ta_2O_5$ . . . TaOx.

FIG. 6 is a TEM view of a TaN-filled via structure in the RRAM bottom electrode fabricated according to some embodiments of the present disclosure. This via shows no voids after planarization.

FIG. 7 shows a TEM view of the resistive structure and the via after patterning the stack of the RRAM, according to some embodiments of the present disclosure. The TEM is taken over an experimental device and the TEM shows that the via is perfectly filled after using the disclosed method of etching a stack of combined layers including various TaN, TiN, TaO, and TiN materials. In this way, good filling of the via is achieved. At the same time, directly using TaN as an electrode on the RRAM device is avoided to simplify the process. Thus, the process requirements for an RRAM project are met.

Overall, the present disclosed method of filling a via of an RRAM resistive structure bottom electrode with TaN, depositing TiN on the via structure, combines TaN and TiN in a stack to etch achieves a fully and well filled via, avoids the negative impact of directly using TaN as an electrode on the device, and reduces dishing occurrence after CMP. Therefore, the present disclosure effectively overcomes the disadvantages of the prior arts, thus, has a high industrial utilization value.

The above-described embodiments merely illustrate the principle and effect of the present invention, and are not intended to limit the present invention. Anyone familiar with this technique can modify or change the above-described embodiments without departing from the spirit and scope of the present invention. Therefore, all equivalent modifications or changes made by those with ordinary knowledge in the technical field to which they belong without departing from the spirit and technical ideas disclosed by the present invention should still be covered by the claims of the present invention.

What is claimed is:

1. A method for making a Resistive Random-Access Memory (RRAM) resistive structure, comprising:
   Step 1, forming a via structure of the RRAM resistive structure;
   Step 2, filling the via structure with a TaN layer, followed by planarizing a surface of the TaN layer over the via structure;
   Step 3, forming a first TiN layer on the TaN-filled via structure; and
   Step 4, patterning an RRAM resistive structure stack on the first TiN layer,
   wherein the patterning of the RRAM resistive structure stack stops at a top surface of the first TiN layer.

2. The method for making the RRAM resistive structure, according to claim 1, wherein forming the via structure in Step 1 comprises depositing a low dielectric constant material layer on a substrate, depositing a copper layer on the low dielectric constant material layer, depositing a carbon-containing silicon nitride layer, and patterning a via in the carbon-containing silicon nitride layer, wherein a bottom of the via exposes the copper layer.

3. The method for making the RRAM resistive structure, according to claim 1, wherein filling the via structure with the TaN layer in Step 2 applies a deposition method.

4. The method for making the RRAM resistive structure, according to claim 3, wherein the deposition method in Step 2 is a physical vapor deposition (PVD) process.

5. The method for making the RRAM resistive structure, according to claim 4, wherein the physical vapor deposition process in Step 2 is a PVD sputtering plate process.

6. The method for making the RRAM resistive structure, according to claim 2, wherein planarizing the surface of the TaN layer over the via structure in Step 2 comprises terminating the planarization after an upper surface of the carbon-containing silicon nitride layer outside the via is exposed.

7. The method for making the RRAM resistive structure, according to claim 1, wherein forming the first TiN layer on the via structure in Step 3, comprise a deposition method.

8. The method for making the RRAM resistive structure, according to claim 7, wherein the deposition method for the first TiN layer is a physical vapor deposition method.

9. The method for making the RRAM resistive structure, according to claim 1, wherein the RRAM resistive structure stack formed on the first TiN layer in Step 4 comprises at least: a TaOx layer, a $Ta_2O_5$ layer, a Ta layer, and a second TiN layer from bottom to top.

10. The method for making the RRAM resistive structure according to claim 9, wherein x in the TaOx is a fraction that is less than $2/5$.

11. The method for making the RRAM resistive structure according to claim 9, wherein the RRAM resistive structure stack further comprises one or more material layers between the TaOx layer and the $Ta_2O_5$ layer, such that no direct contact is between the TaOx layer and the $Ta_2O_5$ layer.

* * * * *